(12) United States Patent
Heath et al.

(10) Patent No.: US 6,459,095 B1
(45) Date of Patent: Oct. 1, 2002

(54) CHEMICALLY SYNTHESIZED AND ASSEMBLED ELECTRONICS DEVICES

(75) Inventors: James R. Heath, Santa Monica, CA (US); R. Stanley Williams, Mountain View, CA (US); Philip J. Kuekes, Menlo Park, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/282,048

(22) Filed: Mar. 29, 1999

(51) Int. Cl.$^7$ .............................................. H01L 29/06

(52) U.S. Cl. ...................................................... 257/14

(58) Field of Search ......................................... 257/14

(56) References Cited

U.S. PATENT DOCUMENTS

| | | | |
|---|---|---|---|
| 3,975,623 A | | 8/1976 | Weinberger ................. 235/152 |
| 4,208,728 A | | 6/1980 | Blahut et al. ............... 365/154 |
| 4,371,883 A | * | 2/1983 | Potember et al. ............. 357/8 |
| 5,272,359 A | * | 12/1993 | Nagasubramanian et al. . 257/40 |
| 5,475,341 A | | 12/1995 | Reed ........................... 327/566 |
| 5,519,629 A | | 5/1996 | Snider ......................... 364/490 |
| 5,640,343 A | | 6/1997 | Gallagher et al. .......... 365/171 |
| 5,729,752 A | | 3/1998 | Snider et al. ............... 395/800 |
| 5,790,771 A | | 8/1998 | Culbertson et al. .... 395/182.01 |

OTHER PUBLICATIONS

J.R. Heath et al, "A Defect–Tolerant Computer Architecture: Opportunities for Nanotechnology", Science, vol. 280, pp. 1716–1721 (Jun. 12, 1998).
L. Guo et al, "Nanoscale Silicon Field Effect Transistors Fabricated Using Imprint Lithography", Applied Physics Letters, vol. 71, pp. 1881–1883 (Sep. 29, 1997).
A.M. Morales et al, "A Laser Ablation Method For The Synthesis Of Crystalline Semiconductor Nanowires", Science, vol. 279, pp. 208–268 (Jan. 9, 1998).
J.R. Heath et al, "A Liquid Solution Synthesis Of Single Crystal Germanium Quantum Wires", Chemical Physics Letters, vol. 208, No. 3, 4, pp. 263–268 (Jun. 11, 1993).
V.P. Menon et al, "Fabrication and Evaluation Of Nanoelectrode Ensembles", Analytical Chemistry, vol. 67, pp. 1920–1928 (Jul. 1, 1995).
L. Guo et al, "A Silicon Single–Electron Transistor Memory Operating At Room Temperature", Science, vol. 275, pp. 649–651 (Jan. 31, 1997).
S.J. Tans et al, "Room–Temperature Transistor Base On A Single Carbon Nanotube", Nature, vol. 393, pp. 49–52 (May 7, 1998).
K.K. Likharev, "Correlated Discrete Transfer Of Single Electrons In Ultrasmall Tunnel Junctions", IBM Journal of Research and Development, vol. 32, No. 1, pp. 144–158 (Jan. 1998).

(List continued on next page.)

*Primary Examiner*—Olik Chaudhuri
*Assistant Examiner*—Douglas A. Wille (57) ABSTRACT

A route to the fabrication of electronic devices is provided, in which the devices consist of two crossed wires sandwiching an electrically addressable molecular species. The approach is extremely simple and inexpensive to implement, and scales from wire dimensions of several micrometers down to nanometer-scale dimensions. The device of the present invention can be used to produce crossbar switch arrays, logic devices, memory devices, and communication and signal routing devices. The present invention enables construction of molecular electronic devices on a length scale than can range from micrometers to nanometers via a straightforward and inexpensive chemical assembly procedure. The device is either partially or completely chemically assembled, and the key to the scaling is that the location of the devices on the substrate are defined once the devices have been assembled, not prior to assembly.

18 Claims, 7 Drawing Sheets

OTHER PUBLICATIONS

R.E. Jones Jr., et al, "Ferroelectric Non–Volatile Memories For Low–Voltage, Low–Power Applications", Thin Solid Films, vol. 270, pp. 584–588 (Dec. 1, 1995).

D.B. Amabilino et al, "Aggregation Of Self–Assembling Branched [n]–Rotaxanes", New Journal of Chemistry, vol. 22, No. 9, pp. 959–972 (Sep. 11, 1998).

T. Vossmeyer et al, "Combinatorial Approaches Toward Patterning Nanocrystals", Journal of Applied Physics, vol. 84, No. 7, pp. 3664–3670 (Oct. 1, 1998).

D.V. Leff et al, "Thermodynamic Control Of Gold Nanocrystal Size: Experiment and Theory", The Journal of Physical Chemistry, vol. 99, pp. 7036–7041 (May 4, 1995).

J.D.L. Holloway et al, "Electron–Transfer Reactions Of Metallocenes: Influences Of Metal Oxidation State On Structure And Reactivity", Journal of the American Chemical Society, vol. 101, pp. 2038–2044 (Apr. 11, 1979).

C. Mead et al, "Introduction to VLSI Systems", Addison–Wesley, Ch. 3, Section 10, pp. 79–82 (1980).

* cited by examiner

CHEMICALLY SYNTHESIZED AND ASSEMBLED ELECTRONICS DEVICES

CROSS-REFERENCE TO RELATED APPLICATIONS

The present application is related to the following applications/patents: Ser. No. 09/280,225, now U.S. Pat. No. 6,314,019, issued Nov. 6, 2001 ("Molecular Wire Crossbar Interconnects for Signal Routing and Communications"); Ser. No. 09/280,189, now U.S. Pat. No. 6,128,214, issued Oct. 3, 2000 ("Molecular Wire Crossbar Memory"); Ser. No. 09/282,045 ("Molecular Wire Crossbar Logic"); Ser. No. 09/282,049, now U.S. Pat. No. 6,256,767, issued Jul. 3, 2001 ("Demultiplexer for a Molecular Wire Crossbar Network (MWCN Demux)"); and Ser. No. 09/280,188 ("Molecular Wire Transistors"), all filed on even date herewith. The present application is the foundational application, upon which the related applications depend for construction of the various devices and apparati disclosed and claimed therein.

This invention was made with Government support under (DMR-9726597) awarded by the National Science Foundation. The Government has certain rights in this invention.

TECHNICAL FIELD

The present invention relates generally to electronic devices whose functional length scales are measured in nanometers, and, more particularly, to simple devices used as building blocks to form more complicated structures, and to the methods for forming such devices. Devices both of micrometer and nanometer scale may be constructed in accordance with the teachings herein.

BACKGROUND ART

The silicon (Si) integrated circuit (IC) has dominated electronics and has helped it grow to become one of the world's largest and most critical industries over the past thirty-five years. However, because of a combination of physical and economic reasons, the miniaturization that has accompanied the growth of Si ICs is reaching its limit. The present scale of devices is on the order of tenths of micrometers. New solutions are being proposed to take electronics to ever smaller levels; such current solutions are directed to constructing nanometer-scale devices.

Prior proposed solutions to the problem of constructing nanometer-scale devices have involved (1) the utilization of extremely fine scale lithography using X-rays, electrons, ions, scanning probes, or stamping to define the device components; (2) direct writing of the device components by electrons, ions, or scanning probes; or (3) the direct chemical synthesis and linking of components with covalent bonds. The major problem with (1) is that the wafer on which the devices are built must be aligned to within a small fraction of the size of the device features in at least two dimensions for several successive stages of lithography, followed by etching or deposition to build the devices. This level of control does not scale well as device sizes are reduced to nanometer scale dimensions. It becomes extremely expensive to implement as devices are scaled down to nanometer scale dimensions. The major problem with (2) is that it is a serial process, and direct writing a wafer full of complex devices, each containing trillions of components, could well require many years. Finally, the problem with (3) is that high information content molecules are typically macromolecular structures such as proteins or DNA, and both have extremely complex and, to date, unpredictable secondary and tertiary structures that cause them to twist into helices, fold into sheets, and form other complex 3D structures that will have a significant and usually deleterious effect on their desired electrical properties as well as make interfacing them to the outside world impossible.

There remains a need for a basic approach to form nanometer-scale devices that can be used to form more complex circuits and systems, and that scale readily and cheaply down to nanometer-scale dimensions.

DISCLOSURE OF INVENTION

In accordance with the present invention, a route to the fabrication of electronic devices is provided, in which the devices consist of two crossed wires sandwiching an electrically addressable molecular species. The approach is extremely simple and inexpensive to implement, and scales from wire dimensions of several micrometers down to nanometer-scale dimensions. The device of the present invention can be used to produce crossbar switch arrays, logic devices, memory devices, and communication and signal routing devices.

The present invention enables construction of molecular electronic devices on a length scale than can range from micrometers to nanometers via a straightforward and inexpensive chemical assembly procedure. The device is either partially or completely chemically assembled, and the key to the scaling is that the location of the devices on the substrate are defined once the devices have been assembled, not prior to assembly.

The electronic device of the present invention, in one realization, is a quantum-state molecular switch comprising an electrically adjustable tunnel junction between two wires. Only at the intersection of the two wires is an actual device defined. The exact position of this intersection is not important for this architecture. The molecular devices sandwiched between the wires can be electrochemically oxidized or reduced. Oxidation or reduction of the molecule forms the basis of a switch. Oxidation or reduction will affect the tunneling distance or the tunneling barrier height between the two wires, thereby exponentially altering the rate of charge transport across the wire junction. Some types of molecules can be cycled reversibly, while others will act irreversibly. The chemical state of the molecular switches determines the tunneling resistance between the two wires.

The present invention solves several problems that currently plague current solid state electronic device technology. First, the fundamental device unit is a molecule or a layer of molecules at the junction of two wires, and so the devices will scale down from wires of micrometer length scales to wires of molecular length scales (a nanometer, for example) without appreciable change in device operation. Second, molecular devices are voltage, not electric field, addressable. This means that molecular switches can be set at one voltage, and the state of the switch can be read at another voltage (either smaller in magnitude or a different polarity), and only two wires are required for the entire process. In most solid-state devices, a total of four wires are required to set and subsequently read the state of a switch. These include two wires that are required to set the state of a switch, and two different wires that are required to read the state of that switch. Third, the devices that are fabricated are extremely versatile, and can be configured to carry out any number of tasks, ranging from memory to logic to communication and signal routing to energy storage. Finally, since only two wires are needed to address and read these devices, and since the device itself is defined not by high resolution lithographic templating, but rather by the relatively arbitrary intersection of two wires, the fabrication process for these wires is substantially simpler and more tolerant of manufacturing deficiencies than is the current art.

BEST MODES FOR CARRYING OUT THE INVENTION

Definitions

As used herein, the term "self-aligned" as applied to "junction" means that the junction that forms the switch and/or other electrical connection between two wires is created wherever two wires, either of which may be coated or functionalized, cross each other, because it is the act of crossing that creates the junction.

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read-only memory (PROM), for example.

The term "reconfigurable" means that a switch can change its state multiple times via a reversible process such as an oxidation or reduction; in other words, the switch can be opened and closed multiple times, such as the memory bits in a random access memory (RAM).

The term "bi-stable" as applied to a molecule means a molecule having two relatively low energy states. The molecule may be either irreversibly switched from one state to the other (singly configurable) or reversibly switched from one state to the other (reconfigurable).

Micron-scale dimensions refers to dimensions that range from 1 micrometer to a few micrometers in size.

Sub-micron scale dimensions refers to dimensions that range from 1 micrometer down to 0.04 micrometers.

Nanometer scale dimensions refers to dimensions that range from 0.1 nanometers to 50 nanometers (0.05 micrometers).

Micron-scale and submicron-scale wires refers to rod or ribbon-shaped conductors or semiconductors with widths or diameters having the dimensions of 1 to 10 micrometers, heights that can range from a few tens of nanometers to a micrometer, and lengths of several micrometers and longer.

Crossed Wire Switch

Figure 1A:
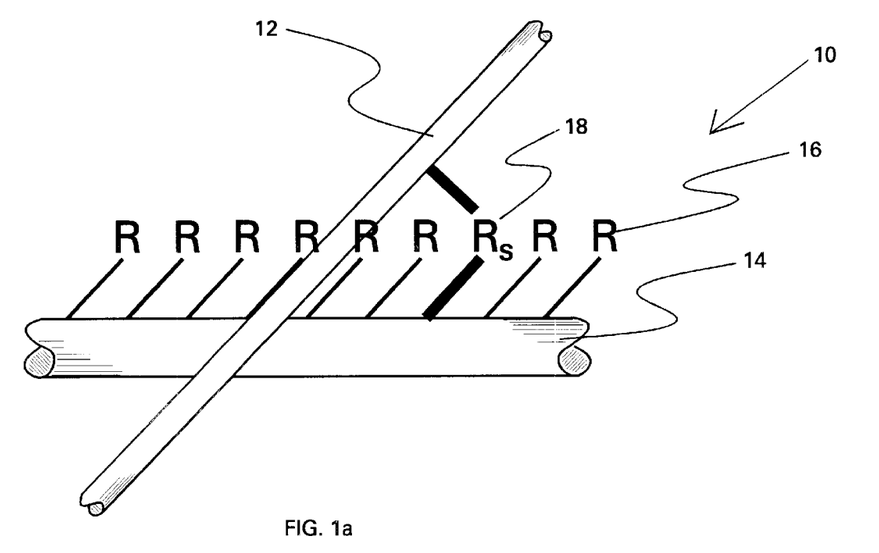
FIG. 1A is a schematic representation of two crossed wires, with at least one molecule at the intersection of the two wires, in accordance with the invention.
Figure 1B:
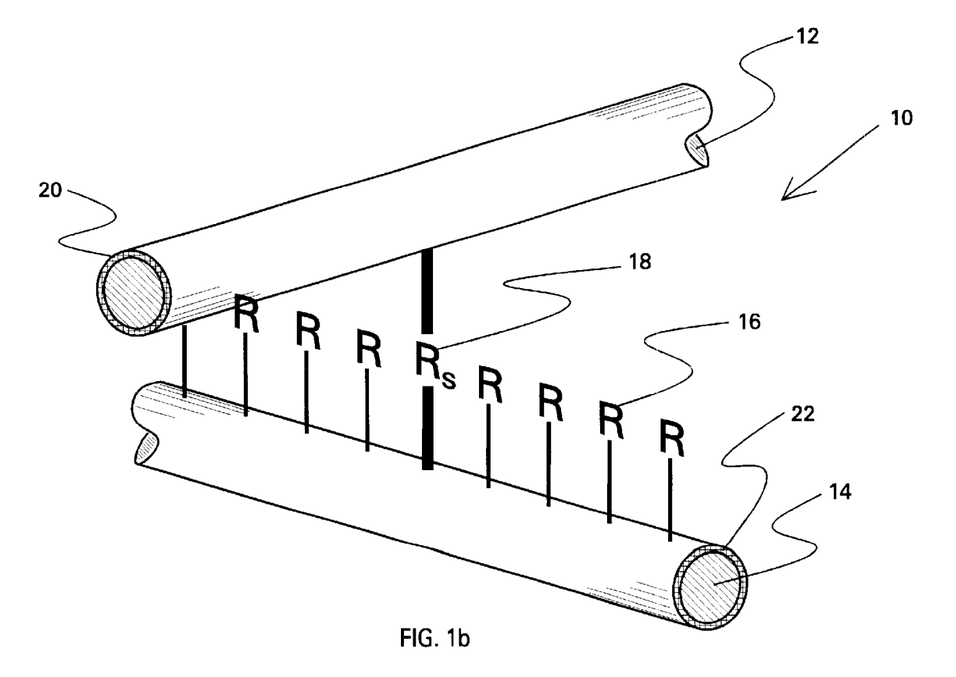
FIG. 1B is a perspective elevational view, depicting the device shown in FIG. 1A.

The essential device features are shown in FIGS. 1A–1B. A crossed wire switch 10 comprises two wires 12, 14, each either a metal or semiconductor wire, that are crossed at some non-zero angle. In between those wires is a layer of molecules or molecular compounds 16, denoted R in FIGS. 1A and 1B. The particular molecules 18 (denoted $R_s$) that are sandwiched at the intersection of the two wires 12, 14 are identified as switch molecules. When an appropriate voltage is applied across the wires, the switch molecules are either oxidized or reduced. When a molecule is oxidized (reduced), then a second species is reduced (oxidized) so that charge is balanced. These two species are then called a redox pair. One example of this device would be for one molecule to be reduced, and then a second molecule (the other half of the redox pair) is oxidized. In another example, a molecule is reduced, and one of the wires is oxidized. In a third example, a molecule is oxidized, and one of the wires is reduced. In a fourth example, one wire is oxidized, and an oxide associated with the other wire is reduced. In all cases, oxidation or reduction will affect the tunneling distance or the tunneling barrier height between the two wires, thereby exponentially altering the rate of charge transport across the wire junction, and serving as the basis for a switch.

The electrical tasks performed by these devices are largely determined by the types of wires (electrodes) and the interwire materials that are used. Table I presents the various types of devices that might be fabricated from various combinations of the wires 12, 14 in FIGS 1A–1B.

TABLE I

| | Wire (Electrode) Materials | | | | |
|---|---|---|---|---|---|
| Device Type | Metal-metal (same) | Metal-metal (different) | Metal-semiconductor | Semiconductor-Semiconductor (p-n junction) | Semiconductor-semiconductor (hetero-junction) |
| Resistor | X | X | X | | |
| Tunneling resistor | X | X | X | | |
| Resonant tunneling resistor | X | X | X | | |
| Diode | | X | X | X | X |
| Tunneling diode | | X | X | X | X |
| Resonant tunneling diode | | X | X | X | X |
| Battery | | X | X | | X |

Depending on the molecules or materials that are used between the wires (the electrodes), each junction can either display the types of electrical function described below immediately on contact of the wires or the junction can have a switching function that acts to connect or disconnect the two wires together electrically. This switch can either be singly configurable or reconfigurable. In the first case, the initial state of the switch is open or closed. Electrically biasing the switch beyond a particular threshold voltage that is determined by the materials in the junction, which is essentially an electrochemical cell, oxidizes or reduces the material or molecules between the wires to irreversibly close or open the switch, respectively, thus permanently reversing its initial state. In the second case, by cycling the polarity and magnitude of the voltage on the switch beyond the appropriate threshold values, it is possible to reversibly oxidize or reduce the properly selected materials or molecules to close or open the switch many times. In either case, when closed, the type of electrical connection that is made between the wires depends upon the materials from which the wires (or electrodes) are fabricated as well as the identity of the molecules or materials between the wires.

Table I above shows a matrix of the various types of functions that can be obtained from various combinations of electrode materials and materials or molecules used in the junction. A resistor has a linear current-voltage characteristic, and is made by intentionally over-reducing the junction between various types of wires to essentially form a short circuit between the wires. The opposite of this process is to over-oxidize a junction, which will consume the wire in a localized region and effectively break the wire (create an open circuit) in that wire at the position of the junction. A tunneling resistor maintains a thin, approximately 2 nanometer thick, insulating barrier between wires and has an exponential current-voltage characteristic. In the case that junction molecules or materials have a sharply defined energy state inside the band gap of an electrically insulating barrier that can be accessed by electrically biasing the junction, the connection between the wires can exhibit a flow of electrical current that is dominated by the process of resonant tunneling. The resonant tunneling can produce one or more inflection points in the otherwise exponential current-voltage characteristic of a tunneling resistor. A diode is a junction that passes current more easily in one direction than in the other, and thus has an asymmetry in the current-voltage characteristic for positive and negative voltages. A tunneling diode has both the positive-negative voltage asymmetry of the diode and the exponential current-voltage characteristic of the tunneling resistor. A resonant tunneling diode has a positive-negative voltage asymmetry plus it has a peak in its current-voltage characteristic, such that over a restricted range of increasing magnitude of the voltage the magnitude of the current actually decreases, a phenomenon that is known as negative differential resistivity. Finally, a battery is a circuit element that acts to hold a constant voltage difference between its electrodes as long as the battery is sufficiently charged, e.g., there is a sufficient supply of oxidizing and reducing agents separated by an insulating barrier. Charging the battery is accomplished by placing the appropriate voltage across the junction, which as stated before is an electrochemical cell, to only partially oxidize or reduce the material or molecules in the junction. In general, any real junction between wires formed by the processes described above will actually have two or more of the electrical functions described, with the effective circuit elements connected in series.

Thus, the present invention may be executed with any number of metallic or semiconducting wire/molecule combinations, depending on the device properties desired from the assembled circuit.

Fabrication of Wire Electrodes

1. Process-Defined Wires (defined as wires that are prepared by conventional electronic-circuit processing techniques; wires are typically prepared on a substrate as part of a circuit):

Metallic and semiconductor wires, with diameters ranging from several micrometers to a single micrometer (defined as micrometer-scale), or with diameters ranging from a single micrometer down to 40 nanometers (defined as sub-micrometer scale) in diameter, may be prepared using well-established art, including lithographic (optical, ultraviolet, or electron beam) technologies. These wires normally have a ribbon shape or rectangular cross section, although circular cross sections are not precluded, with the width of the wire being determined by the lithographic process used to define the wire and its height being defined by the amount of material deposited in the region defined by lithography.

2. Chemically-Prepared Wires (these wires are prepared by techniques other than conventional electronic processing technology; wires are typically prepared as a bulk material, rather than as part of a circuit board):

Metal and semiconductor nanowires are defined as wires with diameters below 50 nanometers (typically 2 to 20 nanometers), and with lengths in the range of 0.1 micrometers to 50 micrometers (typically 5 to 10 micrometers). These may be prepared chemically using any one of a number of techniques described in the references given below.

One example of a reported technique for the production of semiconductor nanowires of the semiconducting element germanium is to react germanium tetrachloride and phenyltrichlorogermanium with a dispersion of sodium metal in the solvent toluene, and at a temperature near 300° C. in a closed vessel, under an inert environment, for a period of several days. That preparation produces single-crystal germanium nanowires of diameters three to thirty nanometers, and of lengths from 0.5 to 10 micrometers.

A second example of a reported technique for the production of semiconductor nanowires of the semiconducting element silicon, is to laser vaporize a target containing elemental silicon and iron. The target is placed in a vacuum oven at 1300° C., and an inert gas is flowed through the oven during the vaporization process. This technique produces silicon wires that have diameters in the range of 20 to 30 nanometers, and lengths ranging from 1 to 20 micrometers.

One example of a reported technique for the production of metallic nanowires of the metallic element gold is to electrochemically grow gold wires within the pores of an anodically etched aluminum oxide thin film. The aluminum oxide is dissolved in acidic solution, releasing the gold nanowires, which are then collected. Gold nanowires grown in this manner are characterized by diameters ranging from 20 to 30 nanometers, and lengths ranging from 0.5 to 5 micrometers.

Nanowires of various metallic and semiconducting materials may be prepared in a variety of fashions that are listed below. Some of these devices will require doped semiconductor wires, such as doped Si.

For the case of Si wires, the wires can be doped when the wires are physically prepared. In this case, it is necessary to add the dopant into the reaction vessel as the wires are formed. For example, in the laser ablation/vacuum oven preparation technique described above, a small amount of dopant gas, such as phosphorus trihydride ($PH_3$) or arsenic trihydride ($AsH_3$) is added into the inert gas (argon, for example) that flows through the vacuum oven during the laser ablation/wire formation process.

Conversely, these wires can be modulation-doped by coating their surfaces with appropriate molecules—either electron-withdrawing groups (Lewis acids, such as boron trifluoride ($BF_3$)) or electron-donating groups (Lewis bases, such as alkylamines) to make them p-type or n-type conductors, respectively. See wire preparation routes listed below. FIG. 1B depicts a coating 20 on wire 12 and a coating 22 on wire 14. The coatings 20, 22 may be modulation-doping coatings, tunneling barriers (e.g., oxides), or other nano-scale functionally suitable materials. Alternatively, the wires 12, 14 themselves may be coated with one or more R species 16, and where the wires cross, $R_s$ 18 is formed. Or yet alternatively, the wires 12, 14 may be coated with molecular species 20, 22, respectively, for example, that enable one or both wires to be suspended to form colloidal suspensions, as discussed below.

To dope the wires via modulation-doping, it is necessary to chemically functionalize the surface of the wires using organic or inorganic molecules that will covalently bind to the Si—O—H groups at the surface of the wires. When silicon nanowires are exposed to air, a thin surface layer (1 nm) of $SiO_2$ will naturally form, and at the $SiO_2$/air interface, the $SiO_2$ surface is terminated by Si—O—H bonds. Groups that will bind to or replace Si—O—H groups are not limited to but include R—Si($CH_3$)$_x$($OCH_{3-x}$), R—Si($CH_3$)$_x$($OCH_2CH_{3-x}$), R—Si($CH_3$)$_x$$Cl_{3-x}$, and others. In this case, R represents an organic or inorganic moiety that can contain electron-withdrawing (a Lewis acid) or electron-donating groups (a Lewis base). This chemistry of binding molecules to a $SiO_2$ passivated silicon surface is well established. One published example reaction for binding molecules to the surface of $SiO_2$ passivated silicon is:

Si—O—H$_{(surface)}$+R—Si($CH_3$)$_2$Cl→Si—O—Si($CH_3$)$_2$R+HCl

Other semiconductor wires can be functionalized with organo-amines, organo-thiols, organo-phosphates, etc.

No previous description of how to modulation-dope chemically synthesized semiconductor nanowires has yet appeared in the literature.

For the case of other nanowires, such as metal nanowires, the wires can be chemically functionalized with R—SH (for gold or silver wires), or R—$NH_2$ (for platinum wires and palladium wires), or R—$CO_2H$ for other metals such as $Al_2O_3$-coated aluminum wires or titanium wires), where the R-group denotes some organic moiety that will lend the wire certain chemical properties—such as the property that will allow the person skilled in the art to disperse the wires, as a colloid, in a solvent. In one example, gold wires might be functionalized with dodecanethiol ($C_{12}H_{25}SH$). The dodecanethiol not only will provide the wires with a thin surface tunneling barrier, but will also allow for the wires to be dispersed in simple organic solvents, such as hexane or chloroform.

Wire Preparation Routes

The following materials may be prepared as nanowires according to the reference listed.

1. Silicon: A. M. Morales et al, "A laser ablation method for the synthesis of crystalline semiconductor nanowires", *Science,* Vol. 279, pp. 208–211 (Jan. 9, 1998).
2. Germanium: J. R. Heath et al, "A liquid solution synthesis of single crystal germanium quantum wires", *Chemical Physics Letters,* Vol. 208, pp. 263—268 (Jun. 11, 1993).
3. Metal Nanowires: V. P. Menon et al, "Fabrication and Evaluation of Nanoelectrode Ensembles", *Analytical Chemistry,* Vol. 67, pp. 1920–1928 (Jul. 1, 1995).
4. Functionalizing Silicon: T. Vossmeyer et al, "Combinatorial approaches toward patterning nanocrystals", *Journal of Applied Physics,* Vol. 84, pp. 3664–3670 (Oct. 1, 1998) (one of a number of references).
5. Functionalizing the Surfaces of Gold Nanostructures: D. V. Leff et al, "Thermodynamic Size Control of Au Nanocrystals: Experiment and Theory", *The Journal of Physical Chemistry,* Vol. 99, p. 7036–7041 (May 4, 1995).

Molecular switching components may come from any number of different classes of molecules, depending, again, on the desired properties of the device. The key requirement of the molecules is that, when they are sandwiched between two wires, they may be electrochemically modified (i.e. oxidized or reduced) by applying a voltage across the wires. When the molecular components are so modified, the net effect is that the tunneling barrier between the two wires is modified, and the rate of current flow is changed. This forms the basis of a switch that can, in turn, be used for memory, logic operations, and communication and signal routing networks. Molecular switches can include redox pairs of molecules, in which application of a voltage reduces one of the molecules and oxidizes the other. An example of such a molecular redox pair might be: nickelocene (di-cyclopentadienyl nickel), or $Cp_2Ni$, with tetrabutylammonium hexafluorophosphate ($Bu_4NPF_6$). The reaction, then, would be:

(reduction) $Cp_2Ni+Bu_4NPF_6 \rightarrow Cp_2Ni^-+Bu_4NPF_6^+ (-1.7\ V)$ or (oxidation) $Cp_2Ni+Bu_4NPF_6 \rightarrow Cp_2Ni^++Bu_4NPF_6^- (-0.1\ V)$ The nickelocene system is of particular interest in that the reduction, as probed by solution phase cyclic voltammetry, is highly asymmetric. Such asymmetry is analogous to magnetization hysteresis curves that form the basis for stable and re-writeable magnetic memory. However, in the presence of oxygen, the reduction of nickelocene is irreversible, as probed by solution phase voltammetry. In either case, reduction or oxidation of this system will modify the tunneling barrier between the two wires between which the molecules are sandwiched. Thus, this system could operate as either a reconfigurable, or a singly configurable molecular switch. For metallocene systems, see, e.g., J. D. L. Holloway et al, "Electron-transfer reactions of metallocenes: Influence of metal oxidation state on structure and reactivity", *Journal of the American Chemical Society,* Vol. 101, pp. 2038–2044 (Apr. 11, 1979).

The connector species 16 comprises a material that displays a significant, or measurable, hysteresis in its current-voltage curve, obtained either from solution electrochemistry or from current-voltage characteristics in a solid-state junction. Examples of such species include metalocenes, rotaxanes, pseudo-rotaxanes, and catenanes.

The present invention can be utilized to form a useful device in any one of three ways. First, if at least one of the wires is a doped semiconductor, then resonant tunneling between the two wires through the electronic states of the molecules will form a resonant-tunneling diode that, among other things, might serve as an inverter logic element. Second, if the redox pair can be reversibly oxidized or reduced, and if there is voltage hysteresis in the oxidation or reduction current/voltage scan, then the device forms the basis for a random access memory element, a re-settable switch, molecular logic gates, or a signal communication/routing network. Finally, if the redox pair can be irreversibly oxidized or reduced, then the device forms the basis for a read-only memory element, a singly configurable switch, logic gates, and a signal communication/routing network.

Figure 2A:
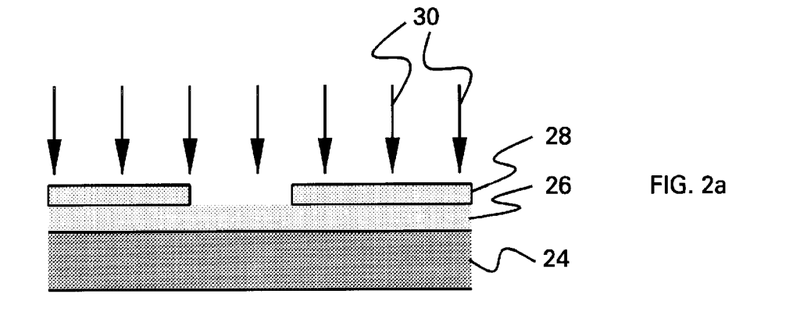
FIG. 2 is a schematic representation of the steps that might be employed to reduce this invention to practice using lithographically deposited (micrometer or sub-micrometer scale diameter) wires.
Figure 2B:
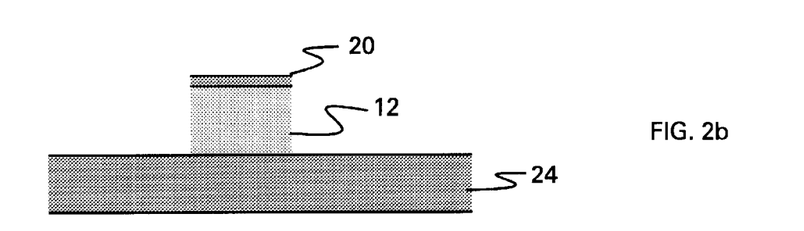
Figure 2C:
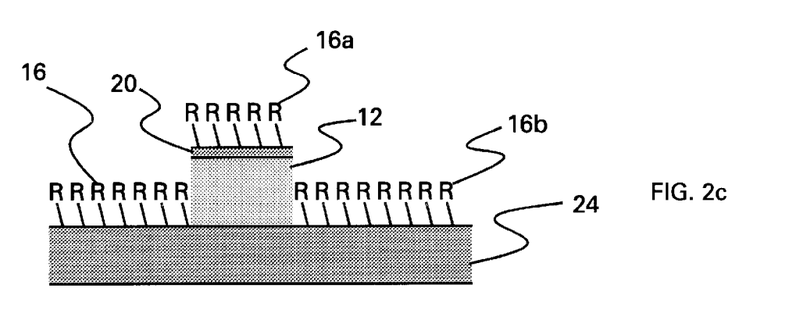
Figure 2D:
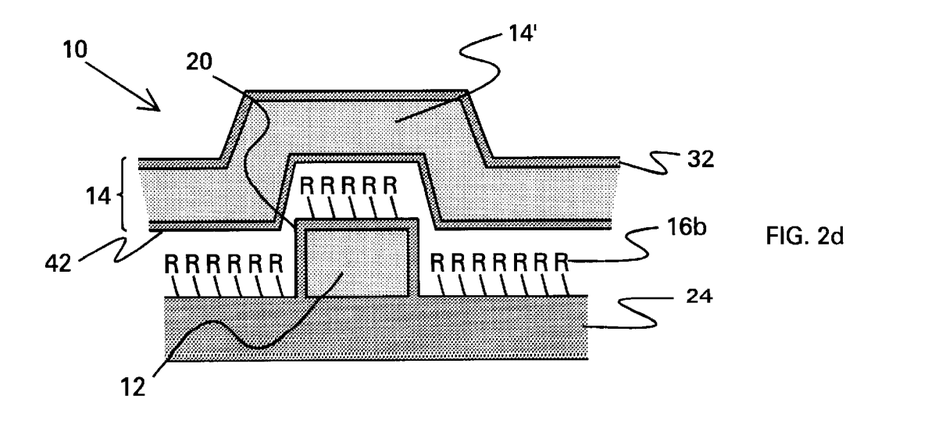

For micrometer-scale wires, devices made from redox pairs could be prepared according to the method depicted in FIGS. 2A–2D. An insulating substrate 24 ($SiO_2$, or example) is coated with a photosensitive resist 26 and then covered with a shadow mask 28 and exposed to light 30, as illustrated in FIG. 2A. The exposed pattern is developed, and a metallic wire 12 (Al, for example) is deposited onto the substrate 24. A thin (1 to 2 nm) insulating layer 20 ($Al_2O_3$) is formed on the Al surface—in this case by simple exposure of the patterned substrate to air, as shown in FIG. 2B. Next, a re-dox pair 16, labeled R in the figure, is deposited either by chemically selective deposition onto the $Al_2O_3$, as a Langmuir film over the entire substrate, or by sublimation of the molecules onto the entire substrate. In the latter case, redox pairs exist both on 16a and off 16b the deposited wire 12 and its insulating layer 20, as shown in FIG. 2C. Next, a second wire 14 is deposited perpendicular to the first wire 12 through a shadow mask. The second wire 14 may include a buffer layer 38 (Ti or Cr, for example) which will form an interface with the deposited molecules, followed by the thicker wire 14' deposited on top of the buffer layer, or it may just consist of a single wire 14. Only where the two wires 12, 14 cross is a device 10 defined, since an application of a voltage across the two wires is necessary to address the device. Thus, as long as the two wires 12, 14 intersect, no further alignment of the two lithographic steps is necessary in order to make a single device 10.

Figure 3A:
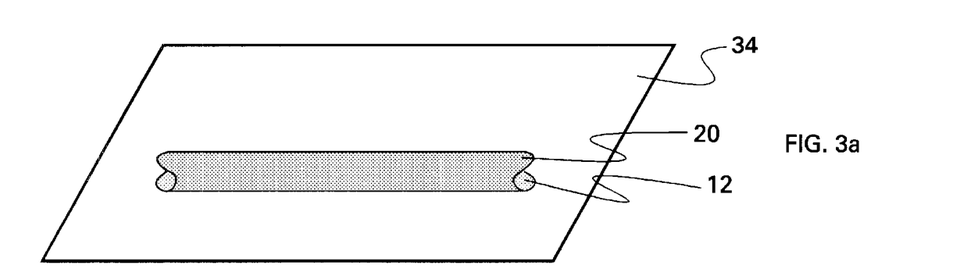
FIG. 3 is a schematic representation of the steps that might be employed to reduce this invention to practice using chemically fabricated (nanometer-scale diameter) wires.
Figure 3B:
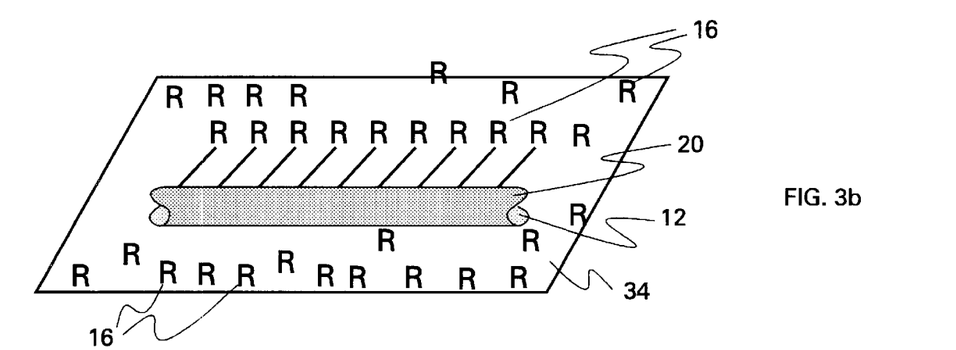
Figure 3C:
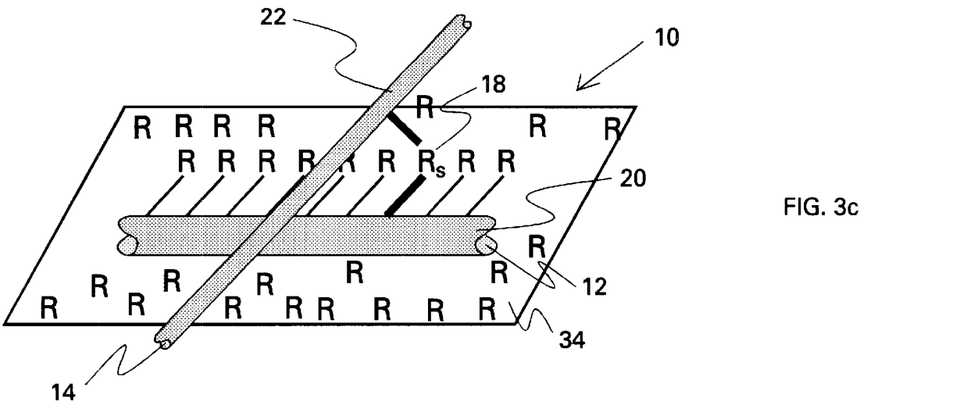

For nanometer scale wires, devices made from redox pairs could be prepared according to the method depicted in FIGS. 3A–3C. On this case, a metal (i.e., gold) or semiconductor (i.e., silicon) nanowire 12, possibly with an insulating surface layer 20 (for silicon, this is the naturally occurring $SiO_2$; for gold, this can be an alkylthiol molecular layer) is deposited on a substrate 34, as illustrated in FIG. 3A. Second, a redox pair of molecules 16 (labeled R in FIG. 3B) is transferred as either a Langmuir-Blodgett film, or via some other form of deposition such as vacuum sublimation. The redox pair 16 can cover both the wire 12 and the substrate 34. In the last step, either a metal or a semiconductor nanowire 14, possibly with an insulating layer (not shown), is deposited across the first wire 12. Only those redox pairs 18 that are sandwiched between the two wires 12, 14 are defined, or can function, as molecular switches 10, as illustrated in FIG. 3C.

In one realization of the present invention, the functional groups on the molecular wires fit together like a lock and key. One wire 12 is coated with one molecular species 20, and the other wire 14 is coated with the other molecular species 22. By the simple process of crossing one type of coated wire over another, the two types of molecules recognize and form links $R_s$ to each other, thus connecting the two wires at a point, and forming a redox pair at that point.

In another realization, one wire 12 is deposited on a substrate, a set of molecular switches is uniformly deposited over the entire substrate, and then a second wire 14 is laid across the first wire. By the simple process of crossing one type of wire over another, a switch 10 is defined at the crossing point of the two wires 12, 14, since it is only at that crossing point that a voltage can be applied to the molecular switch. The remaining molecular switch material could be washed off the substrate, reacted chemically, or simply left in place, depending on subsequent processing requirements. One example of such a device 10 would be to use the scheme described in FIGS. 2A–2D, in which an aluminum electrode 12 is deposited using conventional lithography techniques. Upon exposure of the electrode to air, a thin (1 nm) $Al_2O_3$ layer 20 naturally forms on the surface of the electrode. Second, a thin film 16 of nickelocene is deposited by vacuum sublimation. Finally, a second metal electrode 14 (gold, for example) is deposited perpendicular to the first electrode 12 through a lithographically defined shadow mask. A device 10 fabricated in this way might serve as a reconfigurable switch in which the 'switch-closed' state was a resonant tunneling resistor, and the 'switch-open' state was a tunneling resistor. This device could form the basis of a random access memory, a communications and signal routing network, and a configurable logic network.

In yet another realization, the junction 18 between each pair of crossing wires 12, 14 is a small electrochemical cell that functions as a battery. For operation, the two electrodes 12, 14 are held at a constant potential with respect to each other because the structure of the battery separates two parts of an oxidation-reduction reaction by an insulating barrier, and the only way for the chemical reaction to proceed is to allow current to flow from one electrode to another through an external circuit. The general requirement to form a battery is the two wires or electrodes have to be composed of different elements or compounds. In the junctions described here, each electrode material 12, 14 should have an oxide coating 20, 22, respectively, and may also have an intervening layer of molecules 16 or material that acts to isolate the two electrodes with their oxides from each other (or this isolating may be achieved if the two oxides are thick enough). The battery is charged by applying a voltage of the appropriate polarity and magnitude to drive the junction chemical reaction in the opposite direction that would occur naturally in the junction 18, if the materials were mixed directly. The battery is drained either by shorting the appropriate wires externally or by applying an external voltage to overcome kinetic barriers to the reaction to allow it to go to completion. The battery function of the junction is in effect in series with one of the other functions described for such junctions, e.g., tunneling resistor, etc.

EXAMPLES

Figures 4A, 4B, 4C:
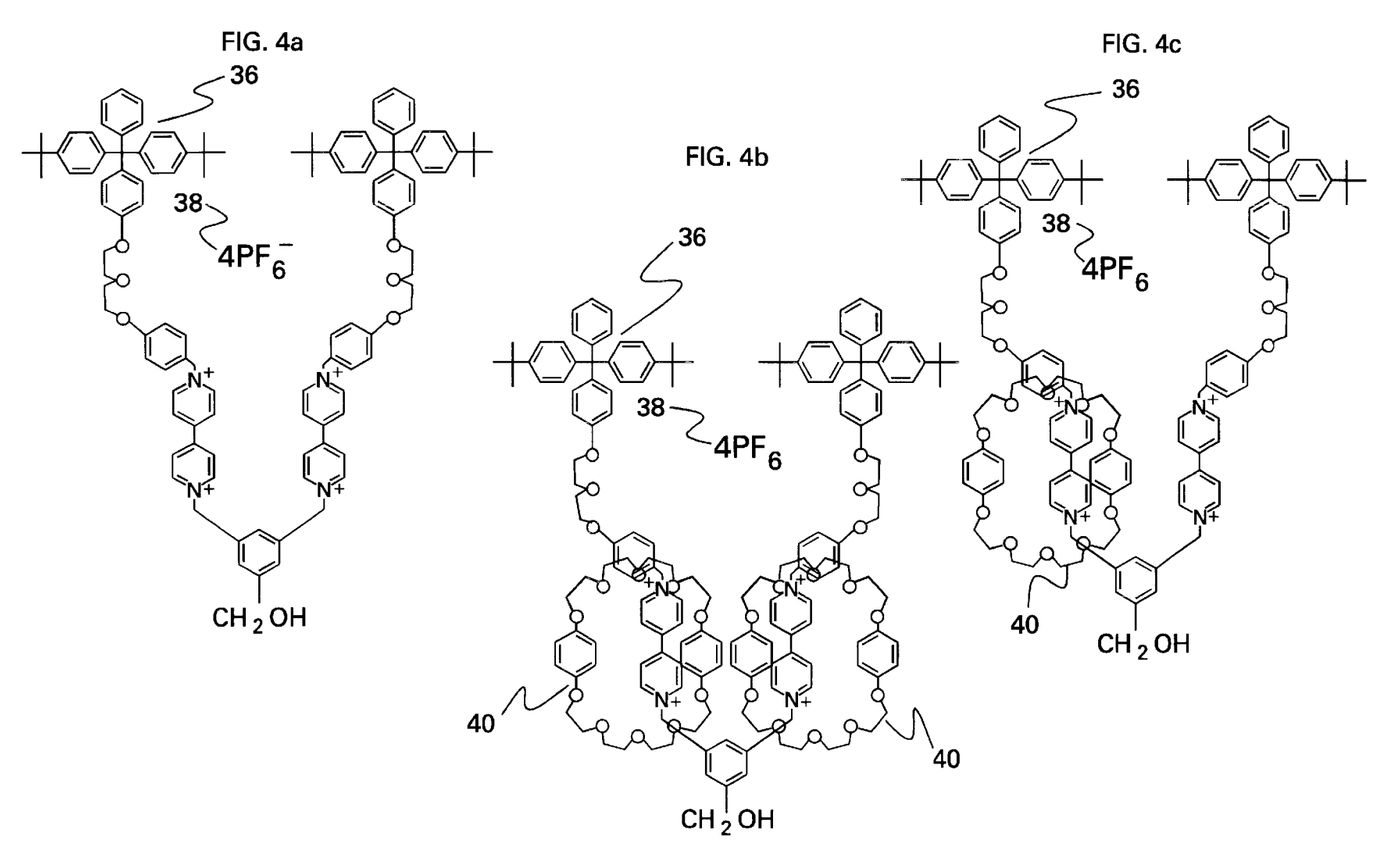
FIGS. 4A, 4B, and 4C depict the molecular structure of three molecular compounds, each of which was utilized to successfully reduce this invention to practice.

The present invention was reduced to practice to make a molecular switch-based device that could be configured as an electrically configurable read-only-memory, nonlinear logic gates that operated as diode-based logic, or a signal routing device. The device was made according to the method described in FIGS. 2A–2D, with the following modifications: A 5 micrometer wide aluminum wire 12 was deposited on a silica substrate 24 using conventional lithographic procedures. The wire 12 was provided with an oxide coating 14 of $Al_2O_3$, which naturally formed to a thickness of about 1.0 to 1.5 nm when the aluminum wire was exposed to air. One of the molecular species shown in FIGS. 4A–4C was dissolved in tetrahydrofuran solvent, prepared as a Langmuir monolayer, and transferred as a Langmuir-Blodgett single molecular monolayer film 16 that covered the Al wire 12 and the silica substrate 24. The molecular compounds shown in FIGS. 4A–4C are from a class of molecular compounds known as rotaxanes. Each molecular compound consists of a dumbbell component 36, a counterion 38, and 0, 1, or 2 (bis-para-phenylene-34-crown-10) rings 40 (FIGS. 4A, 4C, and 4B, respectively).

The conditions for the preparation of the Langmuir monolayer 16 were a surface pressure of 28 milliNewtons/meter which yields a 1 $nm^2$/molecule surface coverage. Previous work on LB films of similar molecules has been reported; see, D. B. Amabilino et al, "Aggregation of self-assembling branched [n]-rotaxanes", *New Journal of Chemistry*, Vol. 22, No. 9, pp. 959–972 (Sep. 11, 1998).

A second, top wire 14 was deposited perpendicular to the first wire 12. The second wire 14 was deposited through a shadow mask using electron beam deposition techniques while the substrate 24 was held at room temperature. For this top wire 14, a thin (5 nm) titanium layer 32 was first deposited across the first wire 12, sandwiching a certain part 18 of the molecular monolayer 16 between the Ti layer 32 and the lower Al wire 12.

Next, the top wire of aluminum 14' was deposited directly on top of the 11 micrometer wide Ti wire 32 through the same shadow mask to an approximate thickness of one micrometer. This titanium/aluminum electrode 14 could be substituted with titanium/gold or chromium/aluminum electrodes, without affecting the basic device properties. Over 100 devices were made this way from each of the three molecular compounds shown in FIGS. 4A–4C, and the yield of operational switch junctions for each case was greater than 90%.

Figure 5:
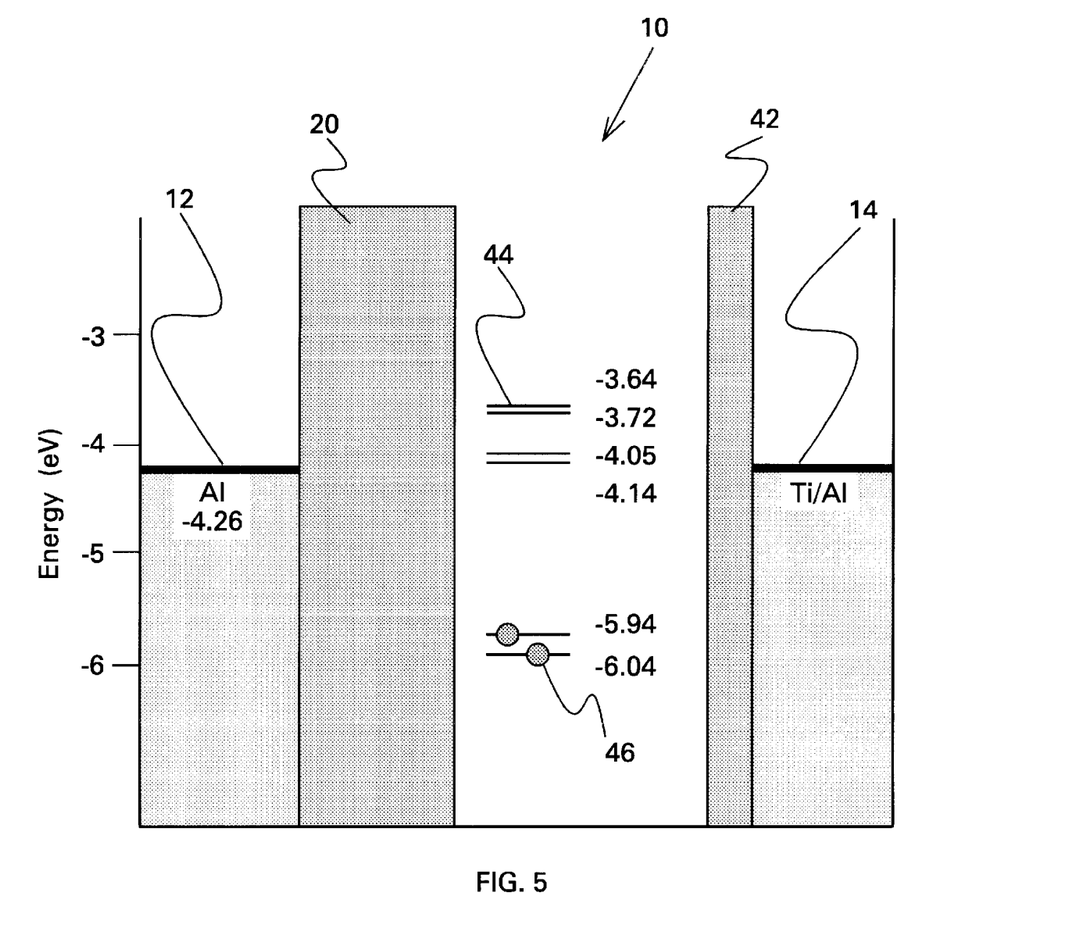
FIG. 5 depicts the energy level diagram of devices made according to the scheme outlined in FIG. 2, and utilizing the molecule depicted in FIG. 4C.
Figure 6A:
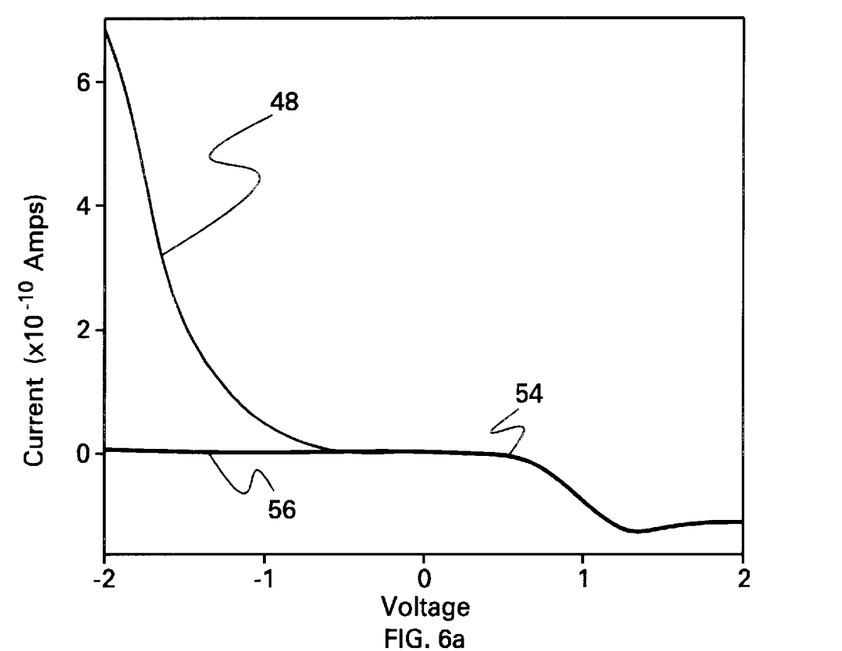
FIG. 6A, on coordinates of current (in amps) and voltage (in volts), is a plot depicting the electrical responses that were measured when a device of the present invention was reduced to practice using the scheme outlined in FIG. 2, and utilizing the specific molecule depicted in FIG. 4C.
Figure 6B:
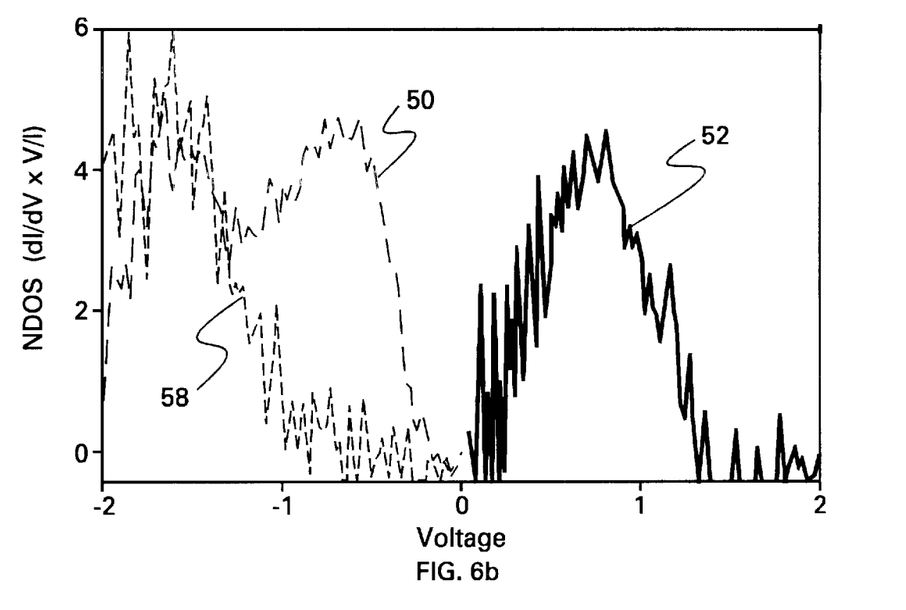
FIG. 6B, on coordinates of normalized density of states (dI/dV×V/I) and voltage (in volts), is a plot depicting an experimental measurement of the electronic energy levels of the molecular switch that was measured in FIG. 6A; the measurements indicate that the wire/molecule/wire junction acts as a resonant tunneling resistor in the 'switch-closed' state, and as a tunneling resistor in the 'switch-open' state.

The electronic energy level diagram of the device 10 is shown in FIG. 5. The energy levels (Fermi level) of the bottom aluminum electrode 12 and the top titanium/aluminum electrode 14 are indicated at either side of the diagram. The $Al_2O_3$ passivating layer 20, and the titanium/molecular interface layer 42 are indicated as tunneling barriers. The energy levels of one of the molecular compounds (FIG. 4C) (this particular molecule contained a dumbbell 36, a counterion 38 and a single ring 40) are indicated as either empty reducing levels 44 or as filled oxidation states 46. These energy levels were measured for this molecule using solution phase pulsed voltammetry. The operation of this device is demonstrated in FIGS. 6A–6B. For all device measurements, the titanium/aluminum electrode 14 was held at ground.

If a negative voltage is applied across the two wires 12, 14, then current tunnels between them. If the applied voltage is such that the empty electronic states 44 of the rotaxane are 'lined up' with the Fermi levels of one of the wires 14, then current flow is greatly enhanced by a resonant tunneling process, and a 'high' rate of current flow is measured in the area of the curve denoted 48 in FIG. 6A. This is defined as the 'switch closed' state. The normalized density-of-states measurement of this resonant tunneling process 50 (FIG. 6B) reveals that tunneling is occurring through the empty electronic states 44 of the rotaxane, thereby forming a resonant tunneling resistor that acts as a closed switch.

If a positive voltage is applied across the two wires 12, 14, then current again tunnels between them. If the applied voltage is such that the filled electronic states 46 (see also Curve 52 in FIG. 6B) of the molecules are 'lined up' with the Fermi levels of one of the electrodes 14, then the rotaxane is oxidized (see the portion of the curve denoted 54 in FIG. 6A). Oxidation of the rotaxane is irreversible, and physically changes its chemical structure, and thus the molecular electronic energy levels in the device 44, 46. When a second current voltage scan from 0 to -2 Volts, denoted 56 in FIG. 6A, is again applied across the wires 12, 14, no resonant tunneling occurs from 0 to -1 V because the empty electronic states 44 of the rotaxane are no longer available (see Curve 58 in FIG. 6B). This forms a tunneling resistor that acts as an open switch. This is seen in the plot of the normalized density of states 58 for this scan 56. As a result, a 'low' rate of current flow is measured at 56.

The foregoing description is that of a singly configurable molecular switch, and can form the basis of certain types of memory, signal routing network, and certain types of logic circuits. The performance of this molecular switch is such that, at -1.8 volts, the ratio of the current flow between a switch 'closed' state 48 and a switch 'open' state 56 is a factor of sixty to eighty, depending on the particular device.

In the 'switch-closed' state, this device could be utilized as a resonant tunneling resistor (with an aluminum bottom electrode 12 and a titanium/aluminum top electrode 14), or a resonant tunneling diode (with a semiconductor, e.g. silicon, bottom electrode 12 and a titanium/gold top electrode 14). In the 'switch-open' state, this device was a tunneling resistor. A device that switches between a resonant tunneling resistor and a tunneling resistor or between a resonant tunneling diode and a tunneling resistor can be utilized to generate wired-logic gates, communications and signal routing circuitry, and programmable read-only memory. The fact that the electronic switching properties of these molecules is the same whether they are isolated molecules in solution (as probed by pulsed voltammetry), or as the junction molecules in these solid-state devices, indicates that these devices will scale from the micrometer-scale dimensions of the working devices discussed here, to nanometer, or molecular scale dimensions.

The technology disclosed and claimed herein for forming crossed wires (micrometer or nanometer) may be used to perform a variety of fictions and to form a variety of useful devices and circuits for implementing computing on a microscale and even on a nanoscale. Molecular wire crossbar interconnects (MWCI) for signal routing and communications arc disclosed and claimed in related application Ser. No. 09/280,225 (U.S. Pat. No. 6,314,019); molecular wire crossbar memory is disclosed and claimed in related application Ser. No. 09280,189 (U.S. Pat. No. 6,128,214); molecular wire crossbar logic (MWCL) employing programmable logic arrays is disclosed and claimed in related application Ser. No. 09/282,045; a demultiplexer for a MWC network is disclosed and claimed in related application Ser. No. 09/282,049 (U.S. Pat. No. 6,256,767); and molecular wire transistors are disclosed and claimed in related application Ser. No. 09/280,188, all filed on even date herewith.

Figure 7:
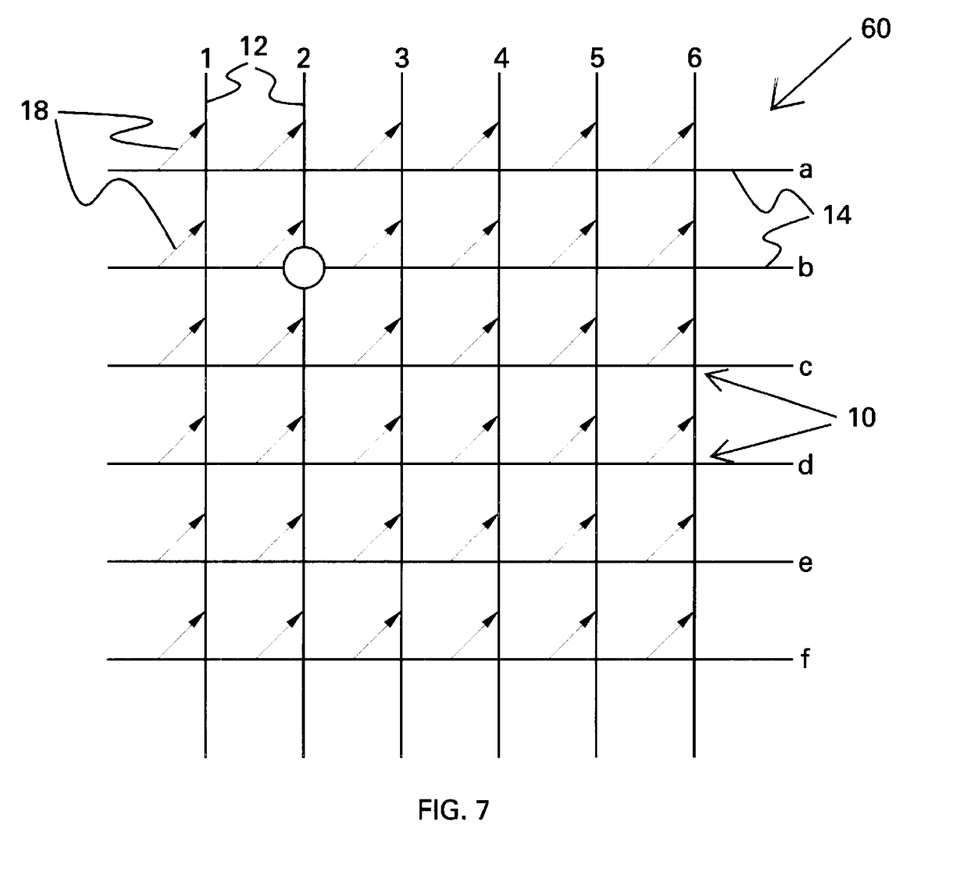
FIG. 7 is a schematic representation of a two-dimensional array of switches of the present invention, depicting a 6×6 crossbar switch.

As illustrated in FIG. 7, the switch 10 of the present can be replicated in a two-dimensional array to form a plurality, or array, 60 of switches to form a crossbar switch. FIG. 7 depicts a 6×6 array 60, but the invention is not so limited to the particular number of elements, or switches, in the array. Access to a single point, e.g., 2b, is done by impressing voltage on wires 2 and b to cause a change in the state of the molecular species 18 at the junction thereof, as described above. Details of the option of the crossbar switch array 60 are further discussed in related application Ser. No. 09/280, 225 (U.S. Pat. No. 6,314,019).

Thus, there has been disclosed chemically synthesized and assembled electronic devices comprising crossed wires joined by electrochemically switchable molecular species at the intersecting junctions. It will be apparent to those skilled in this art that various changes and modifications of an obvious nature may be made, and all such changes and modifications are considered to fall within the scope of the appended claims.

What is claimed is:

1. A crossed-wire device comprising a pair of crossed wires that form a junction where one wire crosses another at an angle other than zero degrees and at least one connector species connecting said pair of crossed wires in said junction, said junction having a functional dimension in nanometers, wherein said at least one connector species and said pair of crossed wires forms an electrochemical cell and wherein said at least one connector species comprises an electrically addressable molecular species.

2. The device of claim 1 wherein said at least one connector species forms a quantum state molecular switch comprising an electrically adjustable tunnel junction between said two wires.

3. The device of claim 1 wherein at least one of said two wires has a thickness that is about the same size as said at least one connector species, and over an order of magnitude longer than its diameter.

4. The device of claim 3 wherein both of said two wires have a thickness that is about the same size as said at least one connector species.

5. The device of claim 1 wherein both of said two wires have a thickness that ranges from sub-micrometer to micrometer.

6. The device of claim 1 wherein said junction is a singly configurable or reconfigurable switch.

7. The device of claim 6 wherein said junction is at least one of elements selected from the group consisting of resistors, tunneling resistors, diodes, tunneling diodes, resonant tunneling diodes, and batteries.

8. The device of claim 1 wherein each said wire independently comprises a conductor or a semiconductor.

9. The device of claim 8 further including an insulating layer or a modulation-doped coating on at least one of said wires.

10. The device of claim 9 wherein said insulating layer comprises an oxide.

11. The device of claim 8 wherein at least one of said wires is a semiconductor and wherein said semiconductor is internally doped.

12. The device of claim 1 wherein said at least one connector species comprises a bi-stable molecule.

13. The device of claim 12 wherein said bi-stable molecule is one that displays a significant hysteresis in its current-voltage curve, obtained either from solution electrochemistry or from current-voltage characteristics in a solid-state junction.

14. The device of claim 12 wherein said device is irreversibly switchable from a first chemical state to a second chemical state of said bi-stable molecule.

15. The device of claim 12 wherein said device is reversibly switchable between a first chemical state and a second chemical state of said bi-stable molecule.

16. The device of claim 12 wherein said connector species comprises a layer of said bi-stable molecules.

17. The device of claim 16 wherein said layer of said bi-stable molecules has a thickness of a monolayer of said bi-stable molecules.

18. The device of claim 12 wherein said connector species is selected from the group consisting of metalocenes, rotaxanes, pseudo-rotaxanes, and catenanes.

* * * * *